United States Patent
Futatsugi

(10) Patent No.: US 6,480,420 B2
(45) Date of Patent: Nov. 12, 2002

(54) SEMICONDUCTOR MEMORY DEVICE HAVING SOURCE AREAS OF MEMORY CELLS SUPPLIED WITH A COMMON VOLTAGE

(75) Inventor: Toshiro Futatsugi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/818,652

(22) Filed: Mar. 28, 2001

(65) Prior Publication Data

US 2002/0031009 A1 Mar. 14, 2002

(30) Foreign Application Priority Data

Sep. 12, 2000 (JP) ........................................ 2000-276398

(51) Int. Cl.$^7$ ............................................... G11C 16/04
(52) U.S. Cl. ............................ 365/185.18; 365/185.28; 365/185.29; 257/316
(58) Field of Search ....................... 365/185.06, 185.17, 365/185.18, 185.28, 185.29, 185.33; 257/315, 316

(56) References Cited

U.S. PATENT DOCUMENTS

| | | | |
|---|---|---|---|
| 4,688,078 A | * | 8/1987 | Hseih ........................ 357/23.5 |
| 5,457,652 A | * | 10/1995 | Brahmbhatt ........... 365/185.06 |
| 5,477,499 A | * | 12/1995 | Van Buskirk et al. ...... 365/218 |
| 5,598,369 A | * | 1/1997 | Chen et al. ............ 365/185.27 |
| 5,781,477 A | * | 7/1998 | Rinerson et al. ....... 365/185.29 |
| 6,195,292 B1 | * | 2/2001 | Usuki et al. ........... 365/185.28 |

FOREIGN PATENT DOCUMENTS

JP 2000-150680 5/2000

\* cited by examiner

*Primary Examiner*—Son Mai
(74) *Attorney, Agent, or Firm*—Armstrong, Westerman & Hattori, LLP

(57) ABSTRACT

A semiconductor memory device having a plurality of memory cells, word lines and bit lines formed on a semiconductor substrate, where each of the memory cells includes a source area formed adjacent to a channel area in the semiconductor substrate; a drain area formed opposite the source area with the channel area therebetween in the semiconductor substrate, the drain area being connected to one of the bit lines; a tunnel insulating film formed on the channel area, the tunnel insulating film having a proper thickness for a carrier to pass through by a tunnel phenomenon; a floating gate formed on the tunnel insulating film so as to overlap neither the source area nor the drain area; a gate insulating film formed on the floating gate so as to cover the floating gate; and a control gate formed on the gate insulating film so as to partially overlap both of the source area and the drain area, the control gate being connected to one of the word lines. In the semiconductor memory device, the source areas of the memory cells are connected to each other so that a common voltage is supplied to each of the source areas.

9 Claims, 9 Drawing Sheets

SEMICONDUCTOR MEMORY DEVICE HAVING SOURCE AREAS OF MEMORY CELLS SUPPLIED WITH A COMMON VOLTAGE

BACKGROUND OF THE INVENTION

1. Field of the Invention

The present invention generally relates to a semiconductor memory device and a controlling method thereof, more particularly, to a semiconductor memory device having a plurality of memory cells, word lines and bit lines formed on a semiconductor substrate, and a controlling method of the semiconductor memory device.

2. Description of the Related Art

Recently, there have been increasing demands for a system LSI having a logic circuit and a memory mounted on a same substrate. Examples of the memory used in the system LSI are a flash memory, a dynamic random access memory (DRAM), a ferroelectric memory (FRAM), etc.

Among these, the flash memory is nonvolatile, and thus provides good process consistency with a MOS field-effect transistor. Therefore, the flash memory is suitable to be mounted on a same substrate with a logic circuit. However, the flash memory is incapable of writing or erasing data at high speed. Hence, when there is a need of writing or erasing data at high speed, the DRAM or the FRAM has to be mounted on the same substrate with a logic circuit. However, since the DRAM and the FRAM comprise a highly dielectric material, a ferroelectric material, or special electrode material, etc., the DRAM or the FRAM provides ill process consistency with a logic circuit.

To solve the abovementioned problem, Japanese Laid-Open Pat. App. No. 2000-150680 discloses a direct tunnel memory (DTM) as a device providing good process consistency with a logic circuit and capable of writing and erasing data at high speed. FIG. 1 is a cross-sectional view of a structure of this direct tunnel memory (DTM). As shown in FIG. 1, each memory cell of the DTM comprises a channel area 5 formed in a semiconductor substrate; a source 1 formed adjacent to the channel area 5 in the semiconductor substrate; a drain 3 formed opposite the source 1 with the channel area 5 therebetween in the semiconductor substrate, the drain 3 being connected to a bit line; a tunnel oxide film 7 formed on the channel area 5, the tunnel oxide film 7 having a proper thickness for a carrier to pass through by a tunnel phenomenon; a floating gate 9 formed on the tunnel oxide film 7 so as not to overlap either the source 1 nor the drain 3; a gate insulating film 10 formed over the floating gate 9; and a control gate 11 formed on the gate insulating film 10 so as to partially overlap both of the source 1 and the drain 3, the control gate 11 being connected to a word line.

As described above, the DTM is a memory using the floating gate 9 similar to a flash memory, with the tunnel oxide film 7 having a thickness thinned down to approximately 2 nm between the channel area 5 and the floating gate 9. It is noted that a tunnel oxide film for a normal flash memory has a thickness of approximately 10 nm.

As a result of the tunnel oxide film 7 having such a reduced thickness, the DTM enables writing or erasing data at high speed with a low voltage. On the other hand, the tunnel oxide film 7 having a reduced thickness may cause a problem of a reduced data-hold property. However, the DTM secures a data-hold time by having the structure in which the floating gate 9 does not overlap either the source 1 nor the drain 3.

FIG. 2 is an illustration for explaining a structure and writing operations of a conventional NOR-type DTM cell array. As shown in FIG. 2, each of memory cells 13a to 13d composing the NOR-type DTM cell array has a gate (the control gate 11) connected to a word line either 15 or 17; and a source (the source 1) and a drain (the drain 3) connected to a pair of bit lines 19 and 21, respectively, or a pair of bit lines 23 and 25, respectively.

Then, when the memory cell 13a is selected as an object to write data in, a voltage $V_{W0}$ of the word line 15 is made a voltage $V_P$ of 4V, and a voltage $V_{W1}$ of the word line 17 is made 0V. Also, a voltage $V_{BS0}$ of the bit line 19 and a voltage $V_{BD0}$ of the bit line 21 are made 0V, and a voltage $V_{BS1}$ of the bit line 23 and a voltage $V_{BD1}$ of the bit line 25 are made the voltage $V_P$ of 4V.

Accordingly, the control gate 11 of the memory cell 13a has a higher electric potential than the source 1 and the drain 3. Thereby, electrons are accumulated in the floating gate 9 so that data of "1" is written in the memory cell 13a. In this course, in the NOR-type DTM cell array shown in FIG. 2, since a source voltage supplied to the memory cells 13a and 13c included in the selected column and a source voltage supplied to the memory cells 13b and 13d included in the unselected column are different, a source line cannot commonly be used to supply a source voltage. This disadvantageously increases a size of the cell.

Next, when data is read from the memory cell 13a in the NOR-type DTM cell array, the voltage $V_{W0}$ of the word line 15 is made a voltage $V_R$ of 2V, and the voltage $V_{W1}$ of the word line 17 is made 0V, as shown in FIG. 3. Also, the voltage $V_{BS0}$ of the bit line 19 is made 0V, and the voltage $V_{BD0}$ of the bit line 21 is made a voltage $V_D$ of 1V. Further, the voltage $V_{BS1}$ of the bit line 23 and the voltage $V_{BD1}$ of the bit line 25 are made 0V.

Thereby, a change of a threshold voltage of the memory cell 13a is detected so that the data is read out.

Next, when data included in a cell area 27 shown in FIG. 4 are erased all at once in the NOR-type DTM cell array, the voltage $V_{W0}$ of the word line 15 is made a voltage $V_E$ of −4V, and the voltage $V_{W1}$ of the word line 17 is made 0V. Also, the voltage $V_{BS0}$ of the bit line 19 and the voltage $V_{BD0}$ of the bit line 21 are made 0V. Further, the voltage $V_{BS1}$ of the bit line 23 and the voltage $V_{BD1}$ of the bit line 25 are also made 0V.

Thereby, electrons are extracted from the floating gate 9 of each of the memory cells included in the cell area 27 to the channel area 5, erasing the data all at once. In this erasing method, there is a disadvantage that all data included in the memory cells connected to the word line 15 are inevitably erased, making the NOR-type DTM cell array unusable for a random access memory.

In addition, when data is held in the memory cell in the NOR-type DTM cell array, the voltage $V_{W0}$ of the word line 15 and the voltage $V_{W1}$ of the word line 17 are made 0V as shown in FIG. 5. Also, the voltage $V_{BS0}$ of the bit line 19 and the voltage $V_{BD0}$ of the bit line 21 are made 0V. Further, the voltage $V_{BS1}$ of the bit line 23 and the voltage $V_{BD1}$ of the bit line 25 are also made 0V.

SUMMARY OF THE INVENTION

It is a general object of the present invention to provide an improved and useful semiconductor memory device and a controlling method thereof in which device and method the above-mentioned problems are eliminated.

A more specific object of the present invention is to provide a semiconductor memory device and a controlling method thereof which device can operate at high speed, has small-sized memory cells, and is randomly accessible.

In order to achieve the above-mentioned objects, there is provided according to one aspect of the present invention a semiconductor memory device having a plurality of memory cells, word lines and bit lines formed on a semiconductor substrate, each of the memory cells comprising:

a source area formed adjacent to a channel area in the semiconductor substrate;

a drain area formed opposite the source area with the channel area therebetween in the semiconductor substrate, the drain area being connected to one of the bit lines;

a tunnel insulating film formed on the channel area, the tunnel insulating film having a proper thickness for a carrier to pass through by a tunnel phenomenon;

a floating gate formed on the tunnel insulating film so as to overlap neither the source area nor the drain area;

a gate insulating film formed on the floating gate so as to cover the floating gate: and a control gate formed on the gate insulating film so as to partially overlap both of the source area and the drain area, the control gate being connected to one of the word lines, wherein the source areas of the memory cells are connected to each other so that a common voltage is supplied to each of the source areas.

According to the present invention, source electrodes can be made common, reducing the sizes of the memory cell and the semiconductor memory device including the memory cells.

Additionally, the semiconductor memory device according to the present invention further comprises:

an erase-voltage generating circuit supplying a first voltage to one of the bit lines connected to selected one of the memory cells, the first voltage being lower than voltages supplied to the others of the bit lines and the common voltage; and a write-voltage generating circuit supplying a second voltage to one of the word lines connected to the selected one of the memory cells, the second voltage being higher than voltages supplied to the others of the word lines and the common voltage.

Additionally, in the semiconductor memory device according to the present invention, the first voltage may be lower than a substrate voltage supplied to the semiconductor substrate.

According to the present invention, electrons can be injected to the floating gate.

On the other hand, in the semiconductor memory device according to the present invention, the write-voltage generating circuit can supply a third voltage to one of the bit lines connected to selected one of the memory cells, the third voltage being higher than voltages supplied to the others of the bit lines and the common voltage, and the erase-voltage generating circuit can supply a fourth voltage to one of the word lines connected to the selected one of the memory cells, the fourth voltage being lower than voltages supplied to the others of the word lines and the common voltage.

According to the present invention, electrons can be extracted from the floating gate of the selected memory cell in a cell-by-cell manner. Accordingly, there is provided a semiconductor memory device that is randomly accessible and is capable of writing and erasing data at high speed.

In order to achieve the above-mentioned objects, there is also provided according to another aspect of the present invention a method of controlling a semiconductor memory device having a plurality of memory cells, word lines and bit lines formed on a semiconductor substrate, each of the memory cells comprising:

a source area formed adjacent to a channel area in the semiconductor substrate;

a drain area formed opposite the source area with the channel area therebetween in the semiconductor substrate, the drain area being connected to one of the bit lines;

a tunnel insulating film formed on the channel area, the tunnel insulating film having a proper thickness for a carrier to pass through by a tunnel phenomenon;

a floating gate formed on the tunnel insulating film so as to overlap neither the source area nor the drain area;

a gate insulating film formed on the floating gate so as to cover the floating gate; and a control gate formed on the gate insulating film so as to partially overlap both of the source area and the drain area, the control gate being connected to one of the word lines, the method comprising the step of:
supplying a common voltage to the source areas of the memory cells connected to each other.

According to the present invention, source electrodes can be made common so that the size of the memory cell is reduced. This also miniaturizes the semiconductor memory device including the memory cells.

Additionally, the method of controlling the semiconductor memory device according to the present invention further comprises:

a first step of supplying a first voltage to one of the bit lines connected to selected one of the memory cells, the first voltage being lower than voltages supplied to the others of the bit lines and the common voltage; and a second step of supplying a second voltage to one of the word lines connected to the selected one of the memory cells, the second voltage being higher than voltages supplied to the others of the word lines and the common voltage.

Additionally, in the method of controlling the semiconductor memory device according to the present invention, the first step of supplying may include the step of supplying the first voltage lower than a substrate voltage supplied to the semiconductor substrate.

According to the present invention, electrons can be injected to the floating gate.

Additionally, in the method of controlling the semiconductor memory device according to the present invention, the second step of supplying may include the step of turning off the others of the memory cells by supplying a voltage to all of the word lines except the selected word line.

According to the present invention, the unselected memory cells are kept from turning on. This avoids increasing an amount of electric power consumed in writing data.

On the other hand, the method of controlling the semiconductor memory device according to the present invention further comprises the steps of:

supplying a first voltage to one of the bit lines connected to selected one of the memory cells, the first voltage being higher than voltages supplied to the others of the bit lines and the common voltage, and supplying a second voltage to one of the word lines connected to the selected one of the memory cells, the second voltage being lower than voltages supplied to the others of the word lines and the common voltage.

According to the present invention, electrons can be extracted from the floating gate of the selected memory cell in a cell-by-cell manner. Accordingly, there is provided a semiconductor memory device that is randomly accessible and is capable of writing and erasing data at high speed.

Other objects, features and advantages of the present invention will become more apparent from the following detailed description when read in conjunction with the accompanying drawings.

DETAILED DESCRIPTION OF THE PREFERRED EMBODIMENTS

Figure 1:
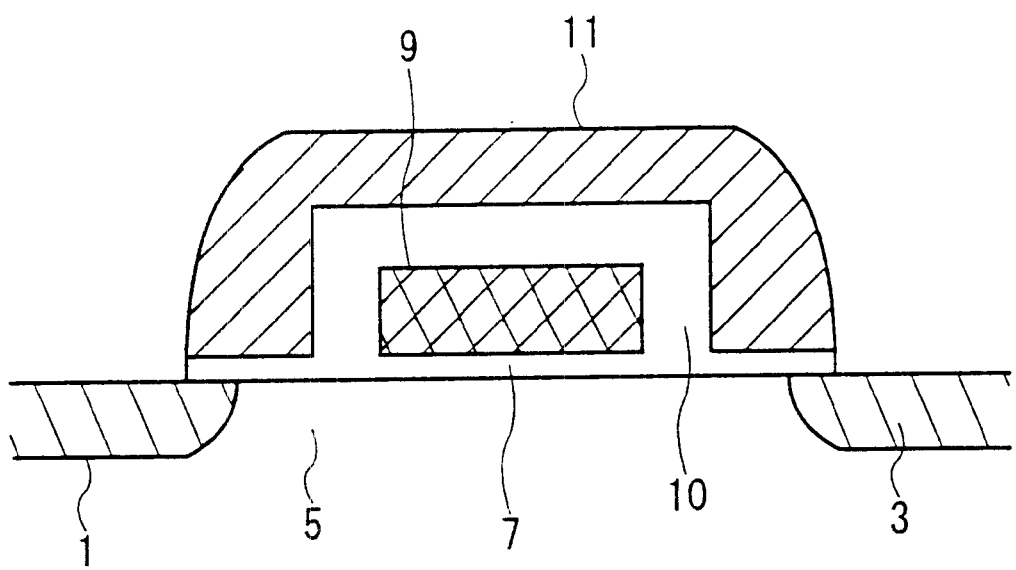
FIG. 1 is a cross-sectional view showing a structure of a direct tunnel memory (DTM)
Figure 2:
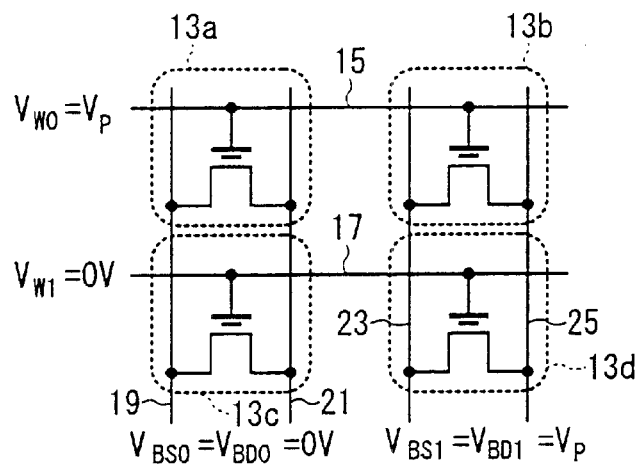
FIG. 2 is an illustration for explaining a structure and writing operations of a conventional DTM cell array.
Figure 3:
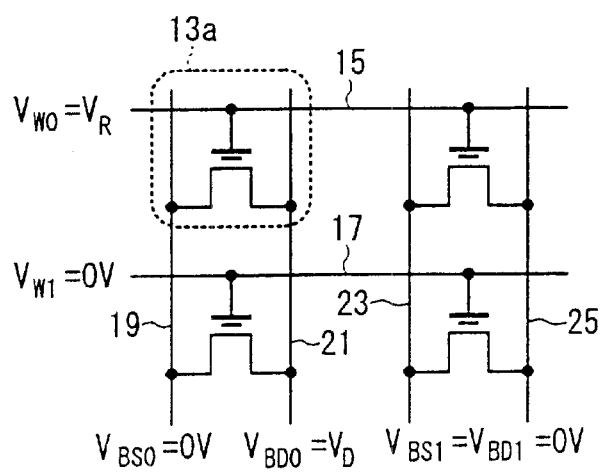
FIG. 3 is an illustration for explaining reading operations of the conventional DTM cell array.
Figure 4:
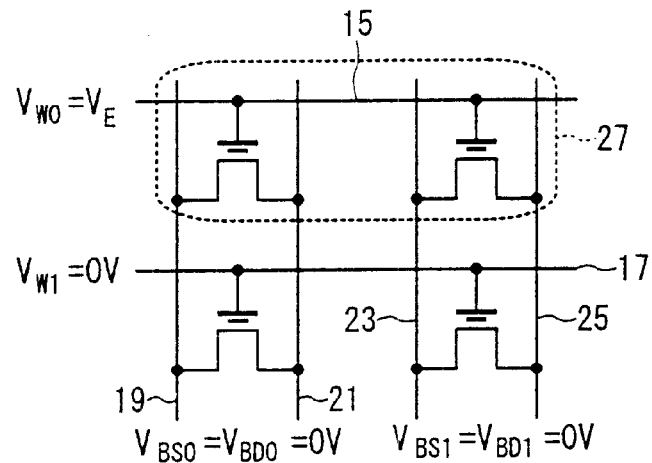
FIG. 4 is an illustration for explaining erasing operations of the conventional DTM cell array.
Figure 5:
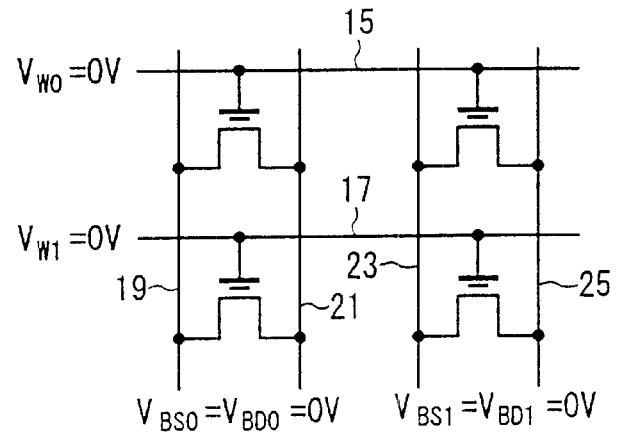
FIG. 5 is an illustration for explaining data-holding operations of the conventional DTM cell array.

A description will now be given, with reference to the drawings, of embodiments according to the present invention. Elements in the drawings that are identical or equivalent are referenced by the same characters.

Figure 6:
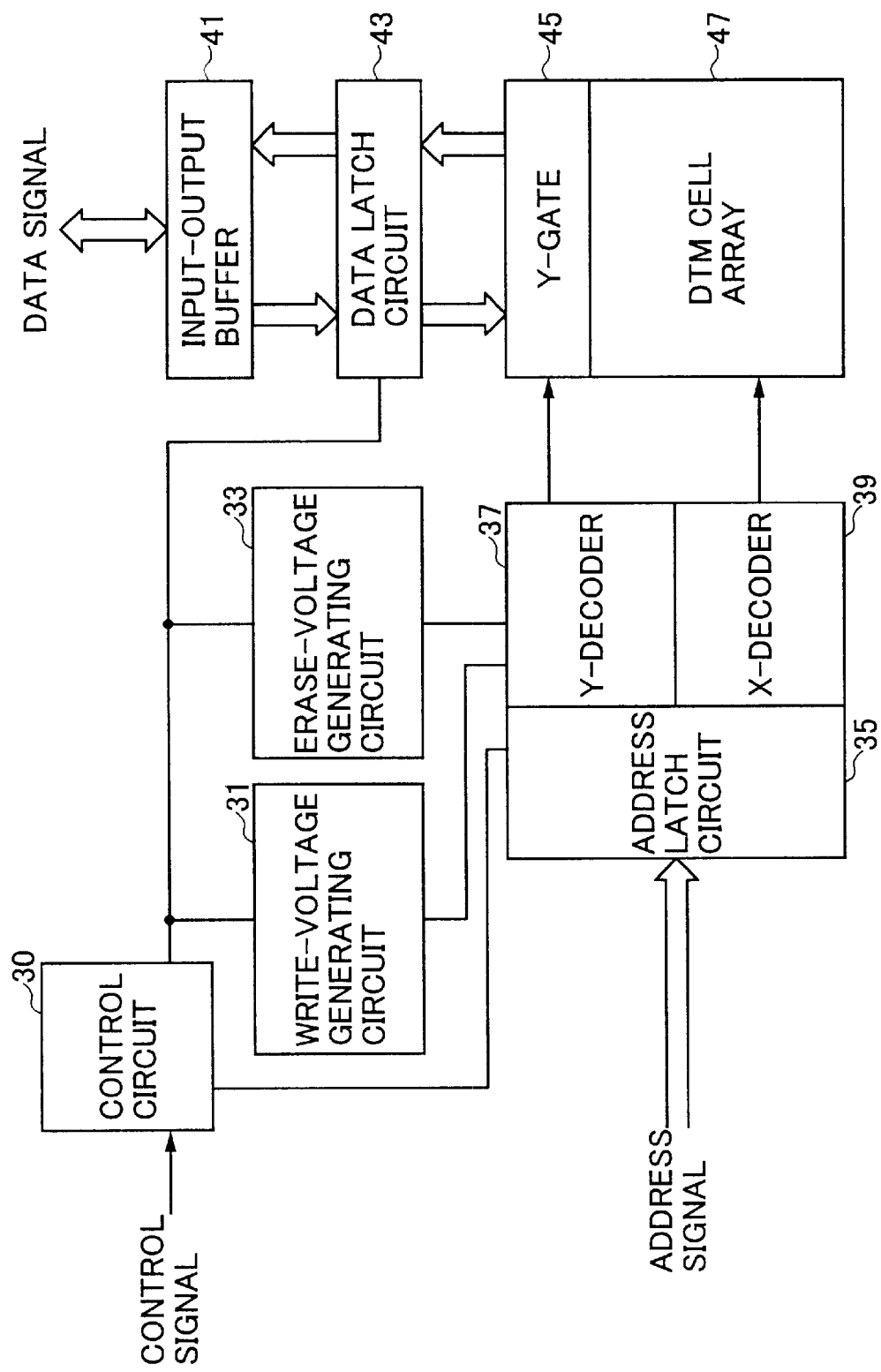
FIG. 6 is a block diagram showing a structure of a semiconductor memory device according to an embodiment of the present invention.

FIG. 6 is a block diagram showing a structure of a semiconductor memory device according to an embodiment of the present invention. As shown in FIG. 6, the semiconductor memory device according to the present embodiment comprises a control circuit 30; a write-voltage generating circuit 31; an erase-voltage generating circuit 33; an address latch circuit 35; a Y-decoder 37; an X-decoder 39; an input-output buffer 41; a data latch circuit 43; a Y-gate 45; and a direct tunnel memory (DTM) cell array 47.

The control circuit 30 is supplied with a control signal. The write-voltage generating circuit 31, the erase-voltage generating circuit 33, the data latch circuit 43 and the address latch circuit 35 are connected to the control circuit 30. The address latch circuit 35 is supplied with an address signal. The Y-decoder 37 and the X-decoder 39 are each connected to the address latch circuit 35, the write-voltage generating circuit 31 and the erase-voltage generating circuit 33. The input-output buffer 41 is connected to the data latch circuit 43, and inputs and outputs a data signal externally. The Y-gate 45 is connected to the Y-decoder 37. The Y-gate 45 is supplied from the data latch circuit 43 with data to be written in the DTM cell array 47, and supplies data read from the DTM cell array 47 to the data latch circuit 43. The DTM cell array 47 is connected to the X-decoder 39 and the Y-gate 45.

Additionally, the X-decoder 39 decodes the address signal supplied thereto so as to select a word line included in the DTM cell array 47. The Y-gate 45 selectively opens a gate according to a decode signal supplied from the Y-decoder 37 so as to activate a bit line connected with a memory cell to which the data is written in or read from in the DTM cell array 47.

Figure 7:
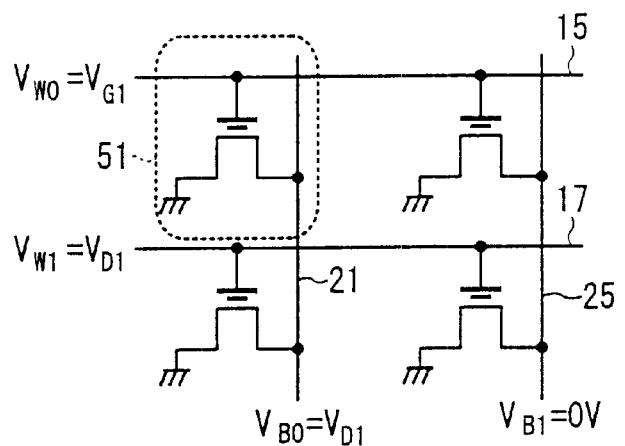
FIG. 7 is an illustration for explaining a first example of writing operations of data "1" in a DTM cell array shown in FIG. 6.

Hereinbelow, a description will be given, with reference to the drawings, of writing, reading and data-holding operations in the above-mentioned DTM cell array 47. FIG. 7 is an illustration for explaining a first example of writing operations of data "1" in the DTM cell array 47 shown in FIG. 6. As shown in FIG. 7, the DTM cell array 47 comprises memory cells. Each of the memory cells comprises the gate (the control gate 11) connected to the word line either 15 or 17; the drain (the drain 3) connected to the bit line either 21 or 25; and the source (the source 1) being grounded. A memory cell 51, for example, comprises the gate (the control gate 11) connected to the word line 15; the drain (the drain 3) connected to the bit line 21; and the source (the source 1) being grounded.

Then, when writing data of "1" to the memory cell 51, the voltage $V_{W0}$ of the word line 15 is made a voltage $V_{G1}$ of 2.5V, and the voltage $V_{W1}$ of the word line 17 is made a voltage $V_{D1}$ of −0.7V, as shown in FIG. 7. Also, a voltage $V_{B0}$ of the bit line 21 is made the voltage $V_{D1}$ of −0.7V, and a voltage $V_{B1}$ of the bit line 25 is made 0V. It is noted that the voltage $V_{G1}$ of 2.5V is generated by the write-voltage generating circuit 31 shown in FIG. 6, and that the voltage $V_{D1}$ of −0.7V is generated by the erase-voltage generating circuit 33 shown in FIG. 6.

Accordingly, when writing data of "1" to the memory cell 51, the selected bit line 21 is supplied with the voltage of −0.7V while the voltage of the unselected bit line 25 and a voltage of source electrodes are made 0V so that the bit line 21 substantially functions as a source. Besides, the selected word line 15 is supplied with the voltage of 2.5V. Thus, a high voltage is impressed only between the bit line 21 and the word line 15 connected with the selected memory cell 51. Therefore, electrons are injected from the channel area 5 to the floating gate 9 in the memory cell 51, so that the data of "1" is written to the floating gate 9 of the memory cell 51.

In this course, the unselected word line 17 is supplied with the voltage of −0.7V so as to prevent unselected memory cells connected to the selected bit line 21 from turning on. This avoids increasing an amount of electric power consumed in writing the data of "1".

It is noted in this case that, if a voltage lower than −1V is impressed to the selected bit line 21, a large forward current flows through a p-n junction between the bit line 21 and the channel area 5 of the selected memory cell 51. Therefore, to prevent this, the selected bit line 21 is, as mentioned above, supplied with the voltage of, for example, −0.7V, which is a negative voltage a little higher than −1V.

Figure 8:
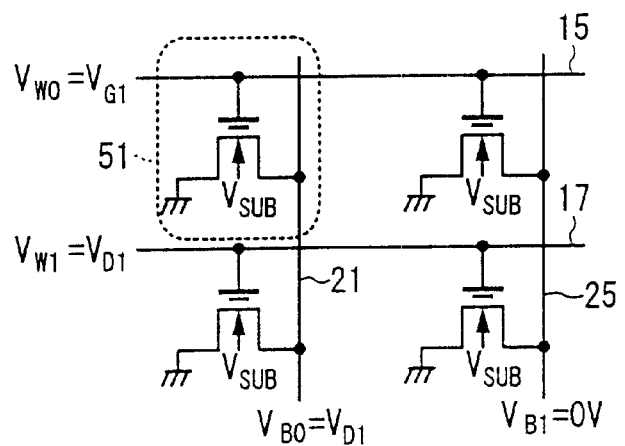
FIG. 8 is an illustration for explaining a second example of writing operations of data "1" in the DTM cell array shown in FIG. 6.

FIG. 8 is an illustration for explaining a second example of writing operations of data "1" in the DTM cell array 47 shown in FIG. 6. As shown in FIG. 8, the DTM cell array 47 has the same structure as in the first example shown in FIG. 7.

Then, when writing data of "1" to the memory cell 51, the voltage $V_{W0}$ of the word line 15 is made the voltage $V_{G1}$ of 2.5V, and the voltage $V_{W1}$ of the word line 17 is made the voltage $V_{D1}$ of −2.0V, as shown in FIG. 8. Also, the voltage $V_{B0}$ of the bit line 21 is made the voltage $V_{D1}$ of −2.0V, and the voltage $V_{B1}$ of the bit line 25 is made 0V. Further, each of the memory cells is supplied with a substrate voltage $V_{SUB}$ of −1.5V. It is noted that the voltage $V_{G1}$ of 2.5V is generated by the write-voltage generating circuit 31 shown in FIG. 6, that the voltage $V_{D1}$ of −2.0V is generated by the erase-voltage generating circuit 33 shown in FIG. 6, and that the substrate voltage $V_{SUB}$ of −1.5V is generated by a substrate-voltage generating circuit (not shown in the figures).

Accordingly, when writing data of "1" to the memory cell 51, the selected bit line 21 is supplied with the voltage of −2.0V while the voltage of the unselected bit line 25 and the voltage of the source electrodes are made 0V. Besides, the selected word line 15 is supplied with the voltage of 2.5V. Further, the substrate voltage $V_{SUB}$ of 1.5V is supplied as a back bias of the floating gate 9. Thereby, electrons are injected from the channel area 5 to the floating gate 9 in the memory cell 51, so that the data of "1" is written to the floating gate 9 of the memory cell 51.

In this course, the unselected word line 17 is supplied with the voltage of −2.0V so as to prevent unselected memory cells connected to the selected bit line 21 from turning on. This avoids increasing an amount of electric power consumed in writing the data of "1".

Figure 9:
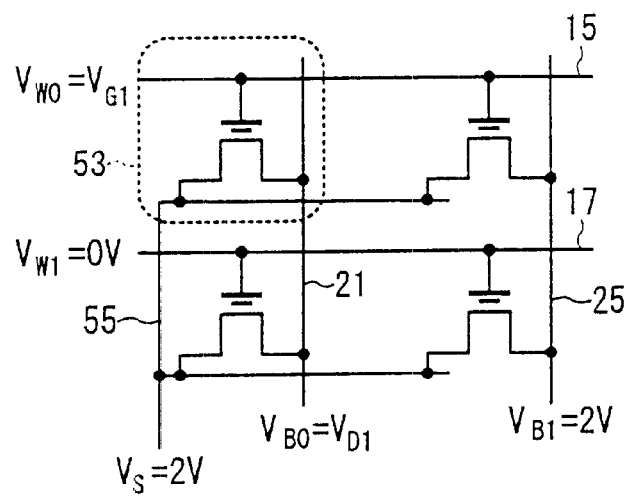
FIG. 9 is an illustration for explaining a third example of writing operations of data "1" in the DTM cell array shown in FIG. 6.

FIG. 9 is an illustration for explaining a third example of writing operations of data "1" in the DTM cell array 47 shown in FIG. 6. As shown in FIG. 9, the DTM cell array 47 comprises memory cells. Each of the memory cells comprises the gate (the control gate 11) connected to the word line either 15 or 17; the drain (the drain 3) connected to the bit line either 21 or 25; and the source (the source 1) connected to a common source line 55. A memory cell 53, for example, comprises the gate (the control gate 11) connected to the word line 15; the drain (the drain 3) connected to the bit line 21; and the source (the source 1) connected to the source line 55.

Then, when writing data of "1" to the memory cell 53, the voltage $V_{W0}$ of the word line 15 is made the voltage $V_{G1}$ of 4V, and the voltage $V_{W1}$ of the word line 17 is made 0V, as shown in FIG. 9. Also, the voltage $V_{B0}$ of the bit line 21 is made the voltage $V_{D1}$ of 0V, and the voltage $V_{B1}$ of the bit line 25 is made 2V. Further, a voltage $V_S$ of the source line 55 is made 2V. It is noted that the voltage $V_{G1}$ of 4V, the voltage $V_{B1}$ of 2V and the voltage $V_S$ are generated by the write-voltage generating circuit 31 shown in FIG. 6.

Accordingly, when writing data of "1" to the memory cell 53, the selected bit line 21 is supplied with the voltage of 0V while the voltage of the unselected bit line 25 and the voltage of the source line 55 are made 2V. Besides, the selected word line 15 is supplied with the voltage of 4V. Thereby, electrons are injected from the channel area 5 to the floating gate 9 in the memory cell 53, so that the data of "1" is written to the floating gate 9 of the memory cell 53.

In this course, the unselected word line 17 is supplied with the voltage of 0V so as to prevent unselected memory cells connected to the selected bit line 21 from turning on.

Next, a description will be given, with reference to FIG. 10, of writing operations of data "0" in the DTM cell array 47 shown in FIG. 6. It should be noted here that writing data "0" means the same as erasing data.

Figure 10:
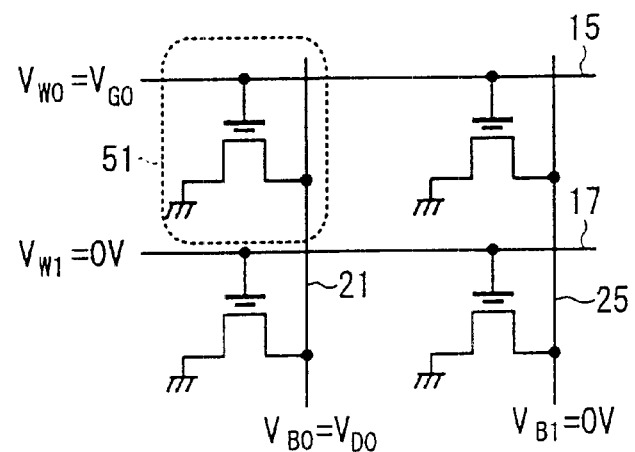
FIG. 10 is an illustration for explaining writing operations of data "0" in the DTM cell array shown in FIG. 6.

As shown in FIG. 10, the DTM cell array 47 has the same structure as in the first example shown in FIG. 7.

Then, when writing data of "0" to the memory cell 51, the voltage $V_{W0}$ of the word line 15 is made a voltage $V_{G0}$ of −2.5V, and the voltage $V_{W1}$ of the word line 17 is made 0V, as shown in FIG. 10. Also, the voltage $V_{B0}$ of the bit line 21 is made a voltage $V_{D0}$ of 3V, and the voltage $V_{B1}$ of the bit line 25 is made 0V. It is noted that the voltage $V_{G0}$ of −2.5V is generated by the erase-voltage generating circuit 33 shown in FIG. 6, and that the voltage $V_{D0}$ of 3V is generated by the write-voltage generating circuit 31 shown in FIG. 6.

Accordingly, when writing data of "0" to the memory cell 51, the selected bit line 21 is supplied with the positive voltage of 3V while the voltages of the unselected bit line 25, the unselected word line 17 and the source electrodes are made 0V. Besides, the selected word line 15 is supplied with the voltage of −2.5V. Thereby, electrons accumulated in the floating gate 9 of the memory cell 51 are extracted therefrom to the drain 3, so that the data of "0" is written to the floating gate 9 of the memory cell 51.

It is noted that distances from the floating gate 9 to the source 1 and the drain 3, a thickness of a sidewall of the control gate 11, and a density of impurities in the channel area 5 are designed so that electrons are extracted only from the floating gate 9 of the selected memory cell to the corresponding drain 3. Additionally, in the above-mentioned course of writing data "0", the unselected word line 17 is supplied with the voltage of 0V so as to prevent electrons being extracted from the floating gates 9 of unselected memory cells connected to the selected bit line 21.

As described above, the semiconductor memory device according to the present embodiment is capable of writing data "0" to each of the memory cells selectively, achieving a cell-by-cell data erasing. This makes the DTM cell array 47 usable for a random access memory.

Figure 11:
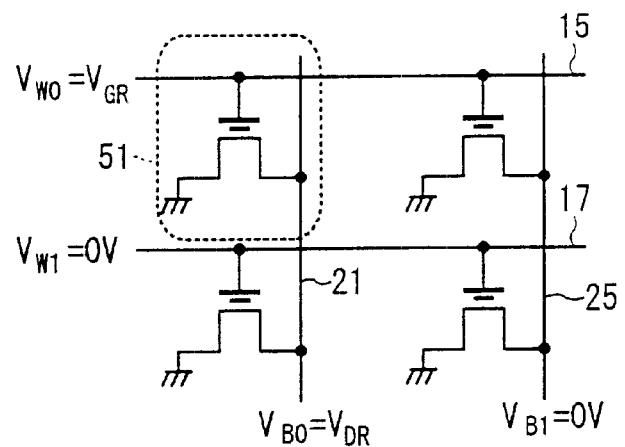
FIG. 11 is an illustration for explaining reading operations in the DTM cell array shown in FIG. 6.

Next, a description will be given, with reference to FIG. 11, of reading operations in the DTM cell array 47 shown in FIG. 6. As shown in FIG. 11, the DTM cell array 47 has the same structure as in the first example shown in FIG. 7.

Then, when reading data from the memory cell 51, the voltage $V_{W0}$ of the word line 15 is made a voltage $V_{GR}$ of 1.5V, and the voltage $V_{W1}$ of the word line 17 is made 0V, as shown in FIG. 11. Also, the voltage $V_{B0}$ of the bit line 21 is made a voltage $V_{DR}$ of 1V, and the voltage $V_{B1}$ of the bit line 25 is made 0V.

Accordingly, when reading data from the memory cell 51, the selected bit line 21 is supplied with the voltage of 1V while the voltages of the unselected bit line 25, the unselected word line 17 and the source electrodes are made 0V. Besides, the selected word line 15 is supplied with the voltage of 1.5V. Thereby, a change of a threshold voltage of the memory cell 51 is detected so that the data is read out from the memory cell 51. It is noted that, in this course, the unselected word line 17 is supplied with the voltage of 0V so as to prevent unselected memory cells connected to the selected bit line 21 from turning on.

Figure 12:
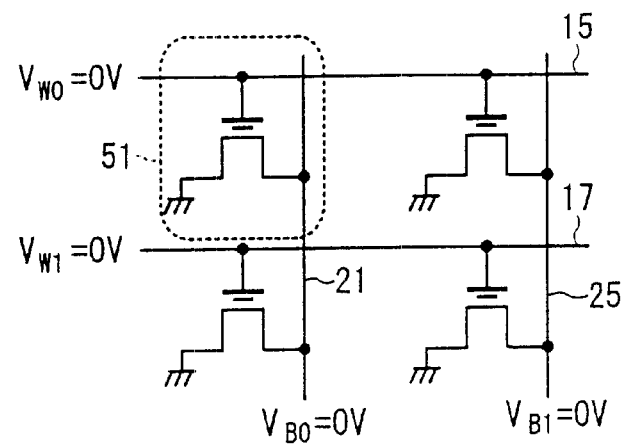
FIG. 12 is an illustration for explaining data-holding operations in the DTM cell array shown in FIG. 6.

Next, a description will be given, with reference to FIG. 12, of data-holding operations in the DTM cell array 47 shown in FIG. 6. As shown in FIG. 12, the DTM cell array 47 has the same structure as in the first example shown in FIG. 7.

Then, when holding data in the memory cell 51, the voltages of the word line 15 and the word line 17 are made 0V, as shown in FIG. 12. Also, the voltages of the bit line 21 and the bit line 25 are made 0V.

It should be noted that, in each of the above-described operations, the source electrode does not necessarily have to be grounded, but may be supplied with a different voltage. In this case, the selected bit lines and word lines need to be supplied with voltages according to the voltage supplied to the source electrode so as to achieve the above-mentioned writing, reading and data-holding operations.

Figure 13:
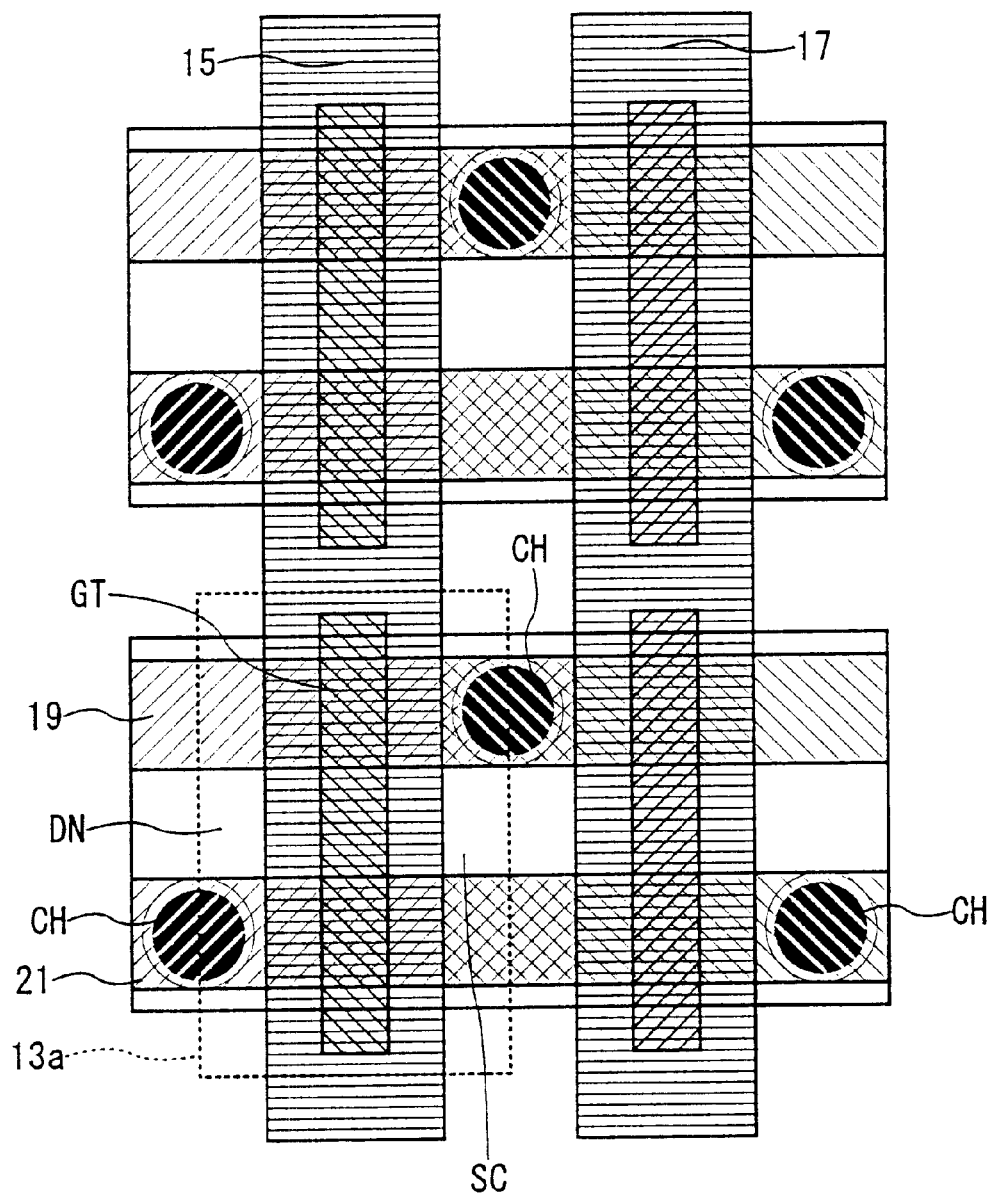
FIG. 13 is a plan view of a layout of a conventional DTM cell.
Figure 14:
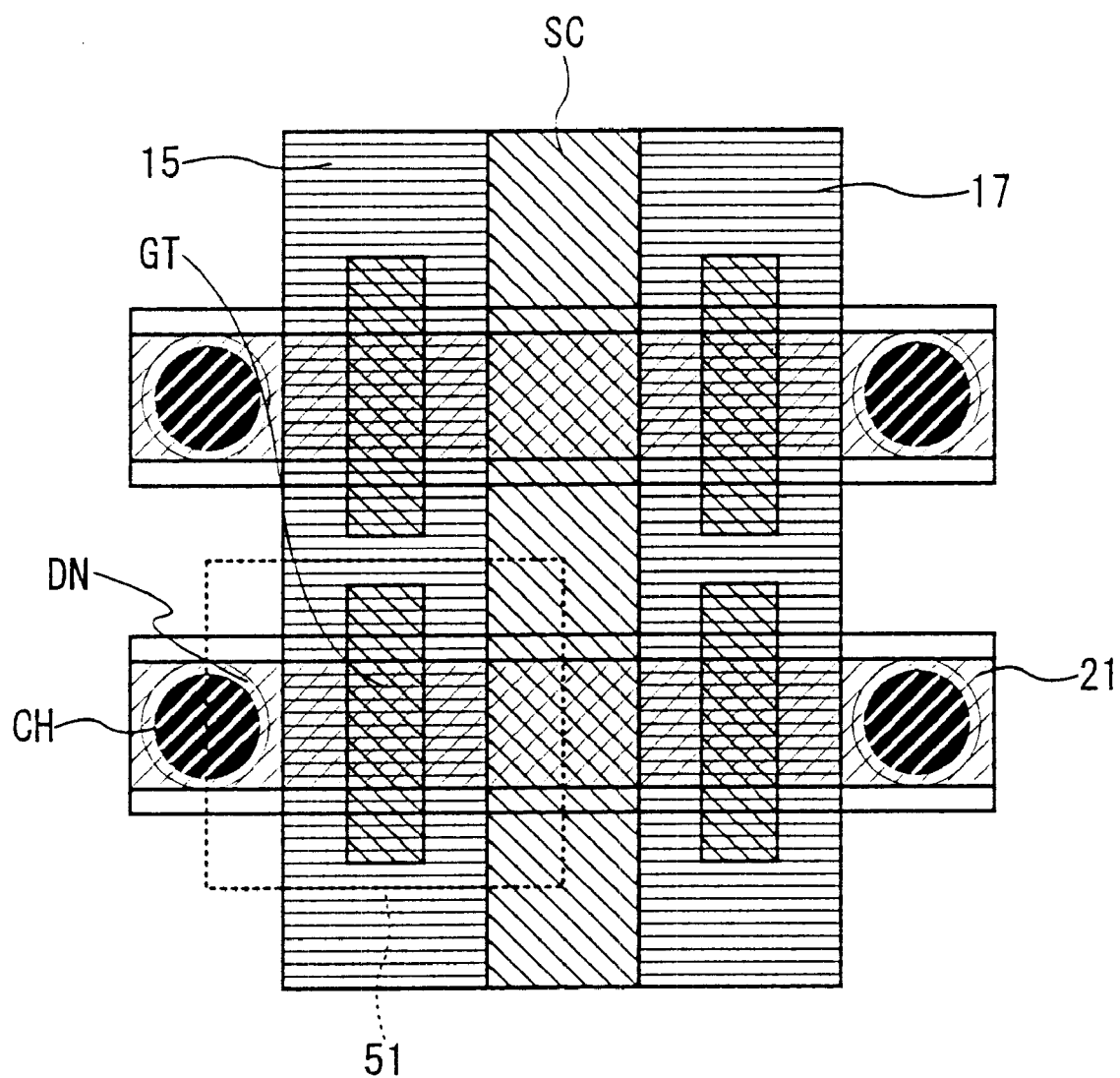
FIG. 14 is a plan view of a layout of a DTM cell composing the DTM cell array shown in FIG. 6.

Next, a description will be given, with reference to FIG. 13 and FIG. 14, of a layout of the memory cell in the DTM cell array 47 shown in FIG. 6. FIG. 13 is a plan view of a layout of a conventional direct tunnel memory (DTM) cell. FIG. 14 is a plan view of a layout of the direct tunnel memory (DTM) cell composing the DTM cell array 47 shown in FIG. 6.

As shown in FIG. 13, in a conventional DTM cell array, the memory cell 13a, for example, comprises a source SC and a drain DN connected to the bit lines 19 and 21 via contact holes CH, respectively; and a gate GT connected to the word line 15.

On the other hand, as shown in FIG. 14, in the DTM cell array 47, the memory cell 51 according to the present embodiment comprises the drain DN connected to the bit line 21 via the contact hole CH; a diffusion layer commonly used for the memory cells as the source SC; and the gate GT connected to the word line 15.

As described above, each memory cell composing the DTM cell array 47 according to the present embodiment has the common source, and thus requires one bit line. Therefore, each memory cell composing the DTM cell array 47 according to the present embodiment has a ratio of 0.54 in area to the conventional memory cell 13a, reducing the size of the memory cell nearly to half.

The present invention is not limited to the specifically disclosed embodiments, and variations and modifications may be made without departing from the scope of the present invention.

The present application is based on Japanese priority application No. 2000-276398 filed on Sep. 12, 2000, the entire contents of which are hereby incorporated by reference.

What is claimed is:

1. A semiconductor memory device having a plurality of memory cells, word lines and bit lines formed on a semiconductor substrate, each of the memory cells comprising:
   a source area formed adjacent to a channel area in said semiconductor substrate;
   a drain area formed opposite said source area with said channel area therebetween in said semiconductor substrate, the drain area being connected to one of said bit lines;
   a tunnel insulating film formed on said channel area, the tunnel insulating film having a proper thickness for a carrier to pass through by a tunnel phenomenon;
   a floating gate formed on said tunnel insulating film so as to overlap neither said source area nor said drain area;
   a gate insulating film formed on said floating gate so as to cover said floating gate; and
   a control gate formed on said gate insulating film so as to partially overlap both of said source area and said drain area, the control gate being connected to one of said word lines,
   wherein the source areas of the memory cells are connected to each other so that a common voltage is supplied to each of the source areas, and
   wherein the memory cells arranged along a selected column are connected to other memory cells arranged along columns other than the selected column.

2. The semiconductor memory device as claimed in claim 1, further comprising:
   an erase-voltage generating circuit supplying a first voltage to one of said bit lines connected to selected one of said memory cells, the first voltage being lower than voltages supplied to the others of said bit lines and said common voltage; and
   a write-voltage generating circuit supplying a second voltage to one of said word lines connected to said selected one of said memory cells, the second voltage being higher than voltages supplied to the others of said word lines and said common voltage.

3. The semiconductor memory device as claimed in claim 2, wherein said first voltage is lower than a substrate voltage supplied to said semiconductor substrate.

4. The semiconductor memory device as claimed in claim 2, wherein said write-voltage generating circuit supplies a third voltage to one of said bit lines connected to selected one of said memory cells, the third voltage being higher than voltages supplied to the others of said bit lines and said common voltage, and
   said erase-voltage generating circuit supplies a fourth voltage to one of said word lines connected to said selected one of said memory cells, the fourth voltage being lower than voltages supplied to the others of said word lines and said common voltage.

5. A method of controlling a semiconductor memory device having a plurality of memory cells, word lines and bit lines formed on a semiconductor substrate, each of the memory cells comprising:
   a source area formed adjacent to a channel area in said semiconductor substrate;
   a drain area formed opposite said source area with said channel area therebetween in said semiconductor substrate, the drain area being connected to one of said bit lines;
   a tunnel insulating film formed on said channel area, the tunnel insulating film having a proper thickness for a carrier to pass through by a tunnel phenomenon;
   a floating gate formed on said tunnel insulating film so as to overlap neither said source area nor said drain area;
   a gate insulating film formed on said floating gate so as to cover said floating gate; and
   a control gate formed on said gate insulating film so as to partially overlap both of said source area and said drain area, the control gate being connected to one of said word lines, wherein the memory cells arranged along a selected column are connected to other memory cells arranged along columns other than the selected column, the method comprising the step of:
   supplying a common voltage to the source areas of the memory cells connected to each other.

6. The method as claimed in claim 5, further comprising:
   a first step of supplying a first voltage to one of said bit lines connected to selected one of said memory cells, the first voltage being lower than voltages supplied to the others of said bit lines and said common voltage; and
   a second step of supplying a second voltage to one of said word lines connected to said selected one of said memory cells, the second voltage being higher than voltages supplied to the others of said word lines and said common voltage.

7. The method as claimed in claim 6, wherein said first step of supplying includes the step of supplying the first voltage lower than a substrate voltage supplied to said semiconductor substrate.

8. The method as claimed in claim 6, wherein said second step of supplying includes the step of turning off the others of said memory cells.

9. The method as claimed in claim 5, further comprising the steps of:
   supplying a first voltage to one of said bit lines connected to selected one of said memory cells, the first voltage being higher than voltages supplied to the others of said bit lines and said common voltage, and
   supplying a second voltage to one of said word lines connected to said selected one of said memory cells, the second voltage being lower than voltages supplied to the others of said word lines and said common voltage.

* * * * *